(12) United States Patent
Jung et al.

(10) Patent No.: US 10,276,721 B2
(45) Date of Patent: Apr. 30, 2019

(54) LIQUID CRYSTAL DISPLAY

(71) Applicant: Samsung Display Co., Ltd., Yongin, Gyeonggi-Do (KR)

(72) Inventors: Jae Hoon Jung, Anyang-si (KR); Heung Shik Park, Seoul (KR); Ki Chul Shin, Seongnam-si (KR); Dan Bi Yang, Gunpo-si (KR); Min-Joo Han, Seoul (KR); Ji Phyo Hong, Pyeongtaek-si (KR)

(73) Assignee: Samsung Display Co., Ltd. (KR)

( * ) Notice: Subject to any disclaimer, the term of this patent is extended or adjusted under 35 U.S.C. 154(b) by 664 days.

(21) Appl. No.: 14/754,039

(22) Filed: Jun. 29, 2015

(65) Prior Publication Data

US 2016/0197195 A1    Jul. 7, 2016

(30) Foreign Application Priority Data

Jan. 6, 2015    (KR) ........................ 10-2015-0001278

(51) Int. Cl.
| | | |
|---|---|---|
| *H01L 29/786* | (2006.01) | |
| *H01L 29/8605* | (2006.01) | |
| *H01L 31/113* | (2006.01) | |
| *G02F 1/133* | (2006.01) | |

(Continued)

(52) U.S. Cl.
CPC ........ *H01L 29/78645* (2013.01); *G02F 1/133* (2013.01); *G02F 1/1368* (2013.01);

(Continued)

(58) Field of Classification Search
CPC ............. H01L 29/786; H01L 29/78645; H01L 29/78633; H01L 27/1251; H01L 29/78663;

(Continued)

(56) References Cited

U.S. PATENT DOCUMENTS

| 6,515,728 B1 | 2/2003 | Song et al. |
|---|---|---|
| 2003/0160237 A1 | 8/2003 | Kawachi et al. |

(Continued)

FOREIGN PATENT DOCUMENTS

| KR | 10-0379858 | 3/2003 |
|---|---|---|
| KR | 10-2006-0001398 | 1/2006 |

OTHER PUBLICATIONS

Siliconix, "FETs as Voltage-Controlled Resistors", Mar. 10, 1997.*

*Primary Examiner* — Daniel Whalen
*Assistant Examiner* — Suberr Chi
(74) *Attorney, Agent, or Firm* — Innovation Counsel LLP

(57) ABSTRACT

A liquid crystal display includes a first gate line, a first data line, and a first pixel. The first pixel includes: a first subpixel including a first thin film transistor connected to the first gate line and data line, and a first liquid crystal capacitor, wherein a first terminal of the first liquid crystal capacitor is electrically connected to the first thin film transistor and a second terminal of the first liquid crystal capacitor is configured to receive a common voltage; and a second subpixel including a second thin film transistor connected to the first gate line and data line, a second liquid crystal capacitor, wherein a first terminal of the second liquid crystal capacitor is configured to receive the common voltage, and a thin film transistor resistor electrically connected between the second thin film transistor and a second terminal of the second liquid crystal capacitor.

15 Claims, 13 Drawing Sheets

(51) Int. Cl.
*G09G 3/36* (2006.01)
*G02F 1/1362* (2006.01)
*G02F 1/1368* (2006.01)
*G02F 1/1343* (2006.01)

(52) U.S. Cl.
CPC ....... *G02F 1/13624* (2013.01); *G09G 3/3648* (2013.01); *H01L 29/78669* (2013.01); *H01L 29/8605* (2013.01); *H01L 31/113* (2013.01); *G02F 2001/134345* (2013.01); *G09G 2300/0447* (2013.01); *G09G 2300/0465* (2013.01); *G09G 2300/0842* (2013.01); *G09G 2320/028* (2013.01)

(58) Field of Classification Search
CPC ............... H01L 29/78669; H01L 29/41; H01L 29/1033
See application file for complete search history.

(56) References Cited

U.S. PATENT DOCUMENTS

| | | | |
|---|---|---|---|
| 2009/0135323 A1* | 5/2009 | Yang | G02F 1/13624 349/37 |
| 2009/0212287 A1 | 8/2009 | Nathan et al. | |
| 2011/0115998 A1* | 5/2011 | Liao | G02F 1/136213 349/38 |
| 2011/0261028 A1* | 10/2011 | Goh | G09G 3/3648 345/204 |
| 2012/0188291 A1* | 7/2012 | Kobayashi | G09G 3/3233 345/690 |
| 2014/0120658 A1* | 5/2014 | Yang | H01L 29/7869 438/104 |

\* cited by examiner

LIQUID CRYSTAL DISPLAY

CROSS-REFERENCE TO RELATED APPLICATION

This application claims priority to and the benefit of Korean Patent Application No. 10-2015-0001278 filed in the Korean Intellectual Property Office on Jan. 6, 2015, the entire contents of which are incorporated herein by reference.

BACKGROUND (a) Technical Field

The present disclosure generally relates to a liquid crystal display having improved lateral display quality.

(b) Description of the Related Art

Flat panel displays for displaying information have been developed. Examples of flat panel displays include liquid crystal displays, organic electro-luminescence display devices, plasma display devices, and field emission displays.

In particular, the liquid crystal display (LCD) has several advantages (e.g., light weight, thin form factor, low power consumption, and rendering of full color videos). As a result, the liquid crystal display is widely used in mobile phones, global positioning systems, monitors, televisions, etc.

The liquid crystal display typically includes two substrates on which electrodes are formed with a liquid crystal layer disposed therebetween. An electric field is formed by applying a voltage to the electrodes on the substrates. The electric field changes the alignment of liquid crystal molecules in the liquid crystal layer and controls transmittance of light passing through the liquid crystal layer, so as to generate an image on the liquid crystal display.

The liquid crystal display includes switching elements coupled to each pixel electrode, and a plurality of signal lines such as gate and data lines to control the switching elements to apply a voltage to the pixel electrode.

Liquid crystal displays may be provided in different configurations. For example, in a vertically aligned mode liquid crystal display, the liquid crystal molecules are aligned so that their long axes are perpendicular to the upper and lower panels when an electric field is not applied to the liquid crystal layer. The vertically aligned mode liquid crystal display device is widely used because it has a high contrast ratio is high and a wide reference viewing angle.

To make the side visibility similar to the front visibility in the vertically aligned mode liquid crystal display, a method has been proposed in which a pixel is divided into two subpixels having different transmittances and different voltages are applied to the two subpixels.

Subpixel configurations such as a charge-shared (CS) scheme or a two-transistor (TT) scheme have been proposed in the above method for forming the subpixels. However, the aforementioned subpixel configurations often require additional thin film transistors or capacitors which may result in reduced aperture ratio.

The above information disclosed in the Background section is only to enhance understanding of the background of the inventive concept and therefore it may contain information that does not form the prior art that is already known in this country to a person of ordinary skill in the art.

SUMMARY

The present disclosure addresses at least the above issues, by providing a liquid crystal display in a vertical alignment (VA) mode including a pixel configuration having a high aperture ratio.

According to an exemplary embodiment of the inventive concept, a liquid crystal display is provided. The liquid crystal display includes: a liquid crystal panel including a plurality of gate lines including a first gate line, a plurality of data lines including a first data line, and a plurality of pixels including a first pixel connected to the first gate line and the first data line, wherein the first pixel is configured to receive a common voltage; a data driver connected to the data line and configured to apply a data voltage; and a gate driver connected to the gate line and configured to apply a gate voltage.

The first pixel includes: a first subpixel including a first thin film transistor connected to the first gate line and the first data line, and a first liquid crystal capacitor, wherein a first terminal of the first liquid crystal capacitor is electrically connected to the first thin film transistor and a second terminal of the first liquid crystal capacitor is configured to receive the common voltage; and a second subpixel including a second thin film transistor connected to the first gate line and the first data line, a second liquid crystal capacitor, wherein a first terminal of the second liquid crystal capacitor is configured to receive the common voltage, and a thin film transistor resistor electrically connected between the second thin film transistor and a second terminal of the second liquid crystal capacitor.

In some embodiments, the thin film transistor resistor may include: an insulating layer; an amorphous silicon layer formed on an upper portion of the insulating layer; a first ohmic contact layer and a second ohmic contact layer formed respectively on upper portions of a first region and a second region of the amorphous silicon layer; a first electrode and a second electrode formed respectively on upper portions of partial regions of the first ohmic contact layer and the second ohmic contact layer; and a third electrode formed on a lower portion of the insulating layer, wherein a resistance of the thin film transistor resistor may be controlled by a voltage applied to the third electrode.

In some embodiments, the third electrode may be formed on a lower portion of a region of the insulating layer overlapping the first electrode, and may not be formed on a lower portion of a region of the insulating layer overlapping the second electrode.

In some embodiments, the third electrode may be separately formed on the lower portion of the region of the insulating layer overlapping the first electrode, and on the lower portion of the region of the insulating layer overlapping the second electrode.

In some embodiments, the resistance of the thin film transistor resistor may be controlled by light from a backlight irradiated onto the lower portion of the insulating layer.

According to another exemplary embodiment of the inventive concept, the thin film transistor resistor includes: an insulating layer; an amorphous silicon layer formed on an upper portion of the insulating layer; a first ohmic contact layer and a second ohmic contact layer formed respectively on upper portions of a first region and a second region of the amorphous silicon layer; a first electrode and a second electrode formed respectively on upper portions of partial regions of the first ohmic contact layer and the second ohmic contact layer; and a third electrode formed on a lower portion of the insulating layer, wherein a resistance of the thin film transistor resistor is controlled by a voltage applied to the third electrode.

In some embodiments, the thin film transistor resistor may include: a first thin film transistor resistor, wherein a positive resistance of the first thin film transistor resistor may be less than a negative resistance of the first thin film transistor resistor; and a second thin film transistor resistor coupled to the first thin film transistor in parallel, wherein a positive resistance of the second thin film transistor resistor may be greater than a negative resistance of the second thin film transistor resistor.

In some embodiments, each of the first thin film transistor resistor and the second thin film transistor resistor may include: an insulating layer; an amorphous silicon layer formed on an upper portion of the insulating layer; a first ohmic contact layer and a second ohmic contact layer formed respectively on upper portions of a first region and a second region of the amorphous silicon layer; a first electrode and a second electrode formed respectively on upper portions of partial regions of the first ohmic contact layer and the second ohmic contact layer; and a third electrode formed on a lower portion of the insulating layer, wherein a third electrode of the first thin film transistor resistor may be formed on the lower portion of the region of the insulating layer overlapping the first electrode, and may not be formed on the lower portion of the region of the insulating layer overlapping the second electrode, and wherein a third electrode of the second thin film transistor resistor may be formed on the lower portion of the region of the insulating layer overlapping the second electrode, and may not be formed on the lower portion of the region of the insulating layer overlapping the first electrode.

In some embodiments, a third electrode of the first thin film transistor resistor may be formed on the lower portion of the region of the insulating layer overlapping the first electrode, and may not be formed on the lower portion of the region of the insulating layer overlapping the second electrode, and a third electrode of the second thin film transistor resistor may be formed on the lower portion of the region of the insulating layer overlapping the second electrode, and may not be formed on the lower portion of the region of the insulating layer overlapping the first electrode.

In some embodiments, each of the first thin film transistor resistor and the second thin film transistor may include: an insulating layer; an amorphous silicon layer formed on an upper portion of the insulating layer; a first ohmic contact layer and a second ohmic contact layer formed respectively on upper portions of a first region and a second region of the amorphous silicon layer; a first electrode and a second electrode formed respectively on upper portions of partial regions of the first ohmic contact layer and the second ohmic contact layer; and a third electrode formed on the lower portion of the region of the insulating layer overlapping the first electrode, and on the lower portion of the region of the insulating layer overlapping the second electrode.

DETAILED DESCRIPTION

Figure 1:
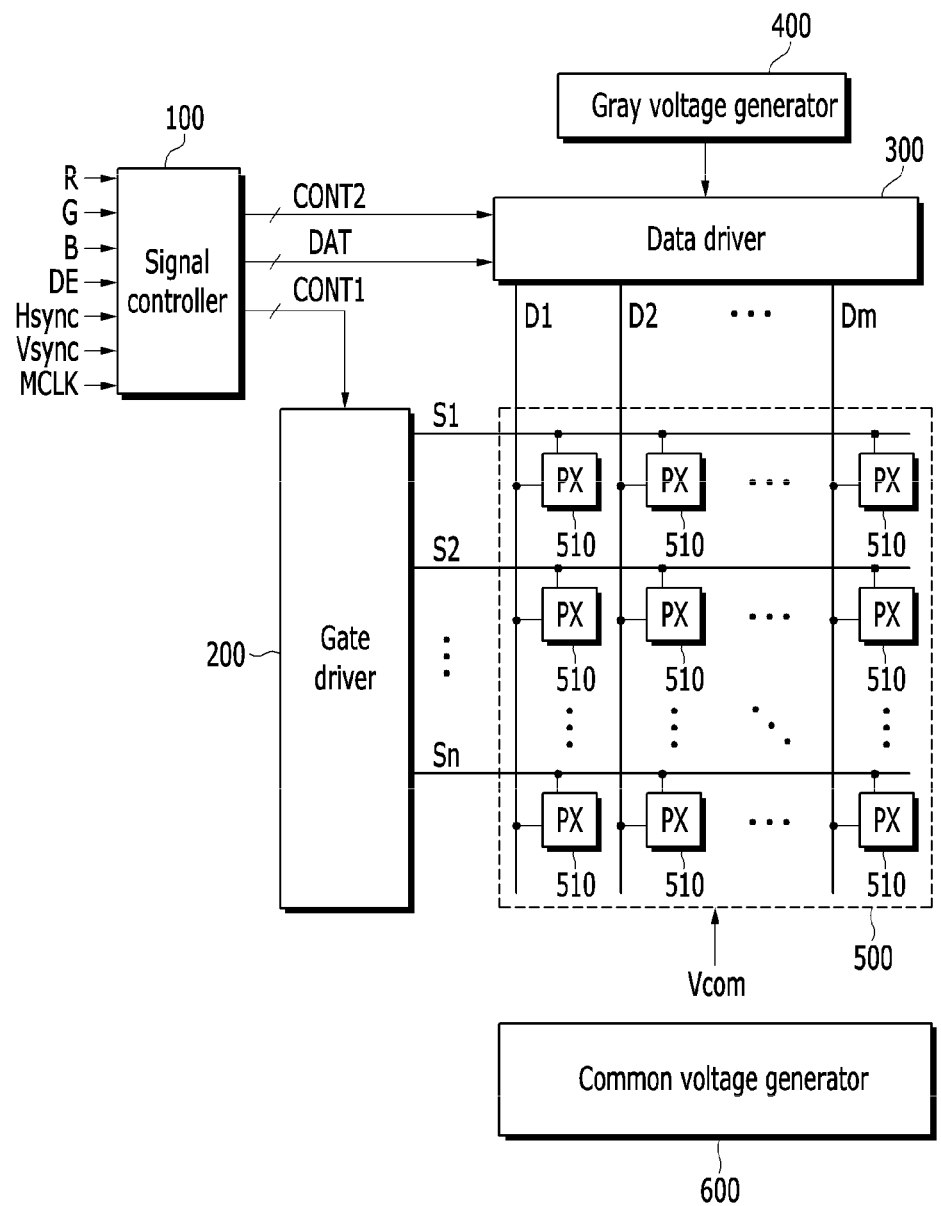
FIG. 1 illustrates a block diagram of a liquid crystal display according to an exemplary embodiment.

In the following description, certain exemplary embodiments of the inventive concept have been shown and described by way of illustration. As those skilled in the art would realize, the embodiments may be modified in various ways without departing from the spirit or scope of the present disclosure.

Like reference numerals designate like element throughout the specification. Once the constituent elements in an exemplary embodiment has been described with reference to the relevant drawings, only constituent elements in other exemplary embodiments that are different from those earlier ones would be described.

In the interest of clarity, features that are known to one of ordinary skill in the art may be omitted.

Throughout this specification and the claims that follow, when an element is described as being "coupled" to another element, the element may be "directly coupled" to the other element or "electrically coupled" to the other element through a third element. In addition, unless expressed otherwise, the word "comprise" and variations such as "comprises" or "comprising" will be understood to imply the inclusion of stated elements but not the exclusion of any other elements.

In the drawings, the thickness of layers, films, panels, regions, etc., may be exaggerated for clarity. It will be understood that when an element such as a layer, film, region, or substrate is referred to as being "on" another element, it can be directly on the other element, or with one or more intervening elements being present. In contrast, when an element is referred to as being "directly on" another element, there are no intervening elements present.

Figure 2:
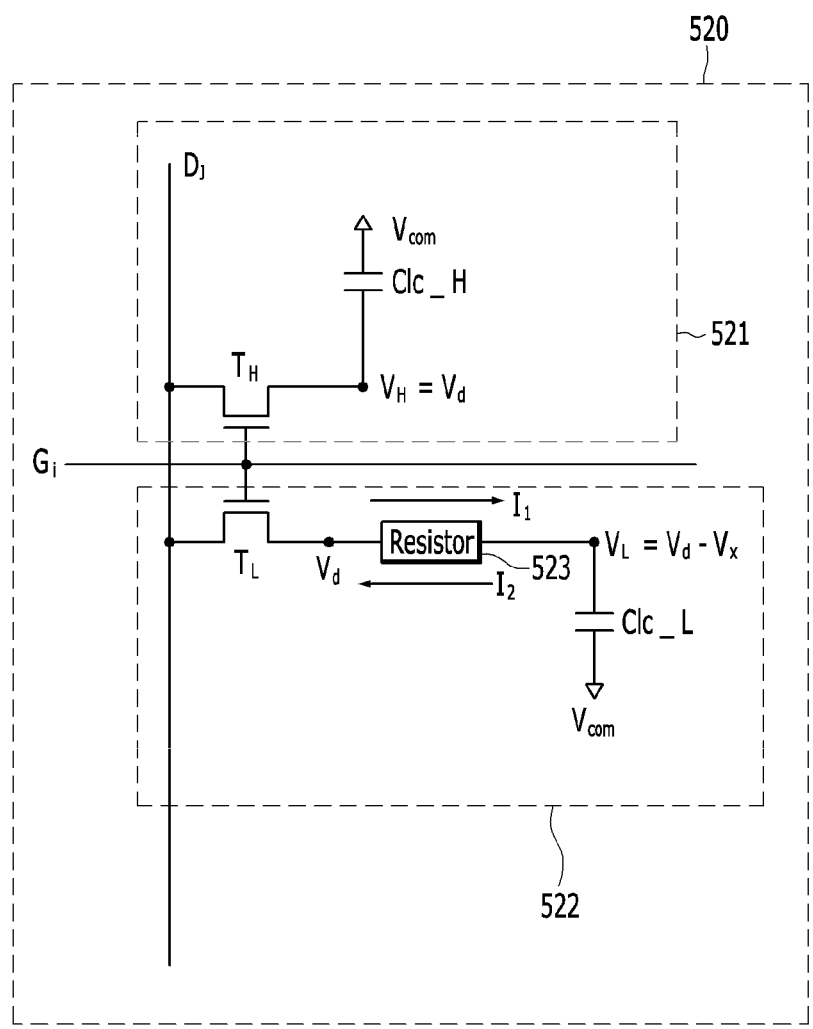
FIG. 2 illustrates a circuit diagram of a pixel in the liquid crystal display of FIG. 1.

FIG. 1 illustrates a block diagram of a liquid crystal display according to an exemplary embodiment, and FIG. 2 illustrates a circuit diagram of a pixel in the liquid crystal display of FIG. 1.

Referring to FIG. 1, the liquid crystal display includes a signal controller 100, a gate driver 200, a data driver 300, a gray voltage generator 400, a liquid crystal panel 500, and a common voltage generator 600.

The liquid crystal panel 500 includes an upper substrate, a lower substrate, and a liquid crystal material provided between the upper and lower substrates. The liquid crystal panel 500 includes a plurality of gate lines (S1-Sn), data lines (D1-Dm), and pixels (PX) 510. The pixels (PX) 510 are connected to the gate lines (S1-Sn) and the data lines (D1-Dm), and are substantially arranged in a matrix form. The gate lines (S1-Sn) extend substantially in a row direction and are substantially parallel with each other. The data lines (D1-Dm) extend substantially in a column direction and are substantially parallel with each other. Although FIG. 1 illustrates the plurality of gate lines (S1-Sn) and the plurality of data lines (D1-Dm) being connected to the plurality of pixels (PX) 510, it is noted that various signal lines (such as a power voltage supply line or a voltage-division reference voltage line) may be additionally connected to the pixels (PX) 510 depending on a configuration of the pixels or a method of driving the pixels.

A backlight unit (not shown) for irradiating light to the liquid crystal panel 500 is provided on a rear side of the liquid crystal panel 500.

The signal controller 100 is configured to receive image signals R, G, and B as well as other input control signals.

The image signals R, G, and B include luminance information on a plurality of pixels. The input control signals include a data enable signal DE, a horizontal synchronizing signal Hsync, a vertical synchronization signal Vsync, and a main clock signal MCLK.

The signal controller 100 is configured to generate a gate control signal CONT1, a data control signal CONT2, and an image data signal DAT according to the image signals R, G, and B, the data enable signal DE, the horizontal synchronizing signal Hsync, the vertical synchronization signal Vsync, and the main clock signal MCLK. The signal controller 100 is configured to divide the image signals R, G, and B for respective frames according to the vertical synchronization signal Vsync, and divide the image signals R, G, and B for respective gate lines according to the horizontal synchronizing signal Hsync, so as to generate the image data signal DAT.

The signal controller 100 is configured to provide the image data signal DAT and the data control signal CONT2 to the data driver 300. The data control signal CONT2 is a signal for controlling the data driver 300. Specifically, the data control signal CONT2 includes a horizontal synchronization start signal for notifying a start of transmission of the image data signal DAT, a load signal for instructing the data lines (D1-Dm) to output a data signal, and a data clock signal. The data control signal CONT2 may further include a reversing signal for reversing a voltage polarity of the image data signal DAT for a common voltage Vcom provided by the common voltage generator 600.

The signal controller 100 is configured to provide the gate control signal CONT1 to the gate driver 200. The gate control signal CONT1 includes a scanning start signal at the gate driver 200 and at least one clock signal for controlling an output of a gate-on voltage. The gate control signal CONT1 may further include an output enable signal for controlling a continuation time of the gate-on voltage.

The data driver 300 is connected to the data lines (D1-Dm) of the liquid crystal panel 500, and configured to select a gray voltage from the gray voltage generator 400. The data driver 300 is configured to apply the selected gray voltage to the data line (D1-Dm) as a data signal. In some embodiments, the gray voltage generator 400 may provide a predetermined number of reference gray voltages rather than voltages for all grays. In those embodiments, the data driver 300 may divide the reference gray voltages to generate gray voltages for all grays, and select a data signal from among the generated gray voltages.

The gate driver 200 is configured to apply a gate signal including a gate-on voltage for turning on a switching element connected to the gate lines (S1-Sn) of the liquid crystal panel 500 and a gate-off voltage for turning off the switching element connected to the gate lines (S1-Sn).

Referring to FIG. 2, an exemplary pixel 520 is connected to a gate line ($G_i$) for transmitting a gate signal and a data line ($D_j$) for transmitting a data signal, and a common voltage $Vc_{om}$ is supplied to each pixel PX.

To enable color expression, each pixel 520 may display one of primary colors including red, green, and blue through spatial division or alternately display the primary colors with respect to time through temporal division, so that a desired color may be achieved by a spatial or temporal sum of the primary colors.

The pixel 520 includes a first thin film transistor ($T_H$), a second thin film transistor ($T_L$), a resistor 523, a first liquid crystal capacitor (Clc_H), and a second liquid crystal capacitor (Clc_L).

The pixel 520 includes a first subpixel 521 and a second subpixel 522. The first subpixel 521 includes the first thin film transistor ($T_H$) and the first liquid crystal capacitor (Clc_H). The second subpixel 522 includes the second thin film transistor ($T_L$), the resistor 523, and the second liquid crystal capacitor (Clc_L).

The first thin film transistor ($T_H$) and the second thin film transistor ($T_L$) are operable as switching elements, and are henceforth referred to as switching thin film transistors (TFTs) so as to distinguish them from the resistors.

Gate electrodes and source electrodes (or drain electrodes) of the first thin film transistor ($T_H$) and the second thin film transistor ($T_L$) are connected to the gate line ($G_i$) and the data line ($D_j$). The drain electrode (or the source electrode) of the first thin film transistor ($T_H$) is connected to the first liquid crystal capacitor (Clc_H), the drain electrode (or the source electrode) of the second thin film transistor ($T_L$) is connected to a first terminal of the resistor 523, and a second terminal of the resistor 523 is connected to the second liquid crystal capacitor (Clc_L).

In the exemplary pixel configuration described above with reference to FIG. 2, when a gate on signal is applied to the gate line ($G_i$), the first thin film transistor ($T_H$) and the second thin film transistor ($T_L$) connected thereto are turned on.

The same data voltage applied to the data line ($D_j$) is also applied to the first subpixel 521 and the second subpixel 522 through the first thin film transistor ($T_H$) and the second thin film transistor ($T_L$) that are turned on.

In the above embodiment, the same data voltage is applied to the first subpixel 521 and the second subpixel 522, a voltage having undergone a voltage drop is applied to the second liquid crystal capacitor (Clc_L) through the resistor 523, and therefore the first liquid crystal capacitor (Clc_H) and the second liquid crystal capacitor (Clc_L) are charged with different voltages.

When the same data voltage is applied to the first subpixel 521 and the second subpixel 522, the voltage charged in the first liquid crystal capacitor (Clc_H) of the first subpixel 521 will be different from the voltage charged in the second liquid crystal capacitor (Clc_L) of the second subpixel 522. Accordingly, inclination angles of liquid crystal molecules in the first subpixel 521 and the second subpixel 522 are different from each other, and luminances of the subpixels 521 and 522 are different from each other. By appropriately controlling the voltage charged in the first liquid crystal capacitor (Clc_H) and the voltage charged in the second liquid crystal capacitor (Clc_L), the image observed on the lateral side of the display device may appear similar to the image observed from the front side of the display device, and as a result, lateral visibility may be improved.

Referring to FIG. 2, when a voltage ($V_d$) applied to the data line ($D_j$) is greater than the common voltage $V_{com}$, a positive (+) voltage is applied to the second liquid crystal capacitor (Clc_L) and a positive first current $I_1$ flows through the resistor 523. When the voltage ($V_d$) applied to the data line ($D_j$) is less than the common voltage $V_{com}$, a negative (−) voltage is applied to the second liquid crystal capacitor (Clc_L) and a negative second current $I_2$ having an opposite direction of the first current flows through the resistor 523.

In FIG. 2, $V_H$ means a voltage applied to a terminal of the first liquid crystal capacitor (Clc_H) and it is the same as the voltage ($V_d$) applied to the date line. $V_L$ means a voltage applied to a terminal of the second liquid crystal capacitor (Clc_L) and it is the same as $V_H - V_x$, where $V_x$ is a voltage drop of the resistor.

In some embodiments, the resistor 523 may be made of amorphous silicon, as described below with reference to FIG. 3.

Figure 3:
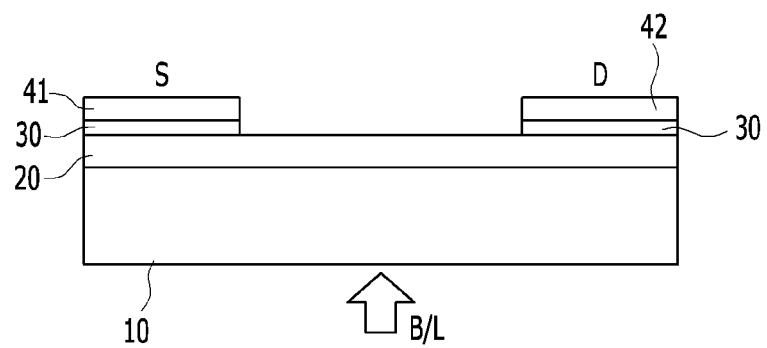
FIG. 3 illustrates an amorphous silicon resistor according to an exemplary embodiment.

FIG. 3 illustrates a resistor made of amorphous silicon (herein referred to as an amorphous silicon resistor) according to an exemplary embodiment.

Referring to FIG. 3, the amorphous silicon resistor includes an insulating layer 10 made of a silicon nitride (SiNx) or a silicon oxide (SiOx), and an amorphous silicon layer 20 made of amorphous silicon formed on an upper portion of the insulating layer 10. The amorphous silicon layer 20 serves as an active layer in the switching TFT, and allows a current to flow between a source electrode 41 and a drain electrode 42.

An ohmic contact layer 30 is formed in a first region and a second region on the upper portion of the amorphous silicon layer 20. The ohmic contact layer 30 can improve the contact resistances between the amorphous silicon layer 20 and the source electrode 41, and between the amorphous silicon layer 20 and the drain electrode 42. In the above embodiment, the ohmic contact layer 30 is formed of amorphous silicon including an n-type impurity.

The layers and electrodes of the resistor shown in FIG. 3 are made of the same materials as the respective layers and the electrodes of the switching TFT. As a result, the switching TFT and the amorphous silicon resistor can be manufactured at the same time without requiring an additional manufacturing process.

The amorphous silicon has a high defect density ($10^{19}/cm^3$) and may not be suitable for use as an active material of the TFT. However, the amorphous silicon is suitable for use as a semiconductor of the switching element since its defect density can be lowered to ($10^{15}/cm^3$) by reducing a number of dangling bonds through hydrogenation or reducing a localized state in a bandgap.

The hydrogenated amorphous silicon has an optical bandgap of about 1.8 eV, a dark conductivity of about $3 \times 10^{-10}$ (S/cm), and a photoconductivity of about $1 \times 10^{-4}$ (S/cm). The conductivity of the amorphous silicon can be varied by light (e.g., light provided by a backlight B/L) since the amorphous silicon has a photo-conductive characteristic.

Figure 4:
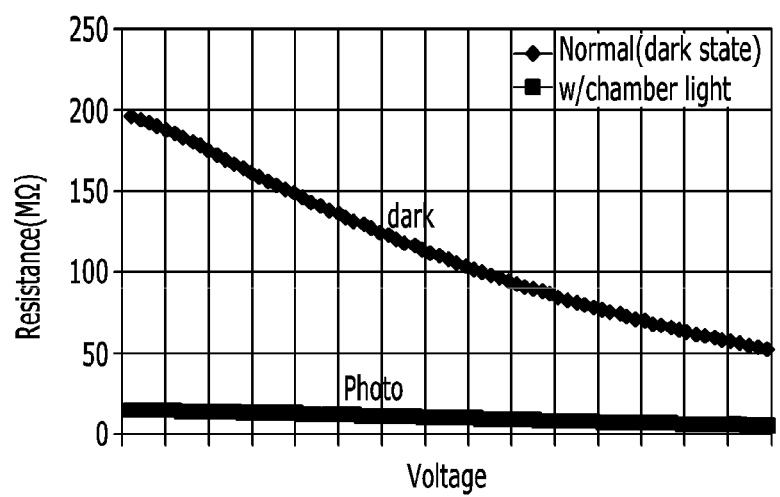
FIG. 4 is a graph of a resistance characteristic of the amorphous silicon resistor of FIG. 3.

FIG. 4 is a graph of a resistance characteristic of the amorphous silicon resistor of FIG. 3. Specifically, FIG. 4 is a plot of resistance as a function of voltage for the following cases: (1) when light from a backlight is applied to the amorphous silicon resistor; and (2) when light from the backlight is not applied to the amorphous silicon resistor. Referring to FIG. 4, when light from the backlight is applied to the amorphous silicon resistor (i.e., a light state, "Photo"), the resistance of the amorphous silicon resistor is reduced compared to a state in which light from the backlight is not applied (i.e., a dark state). Furthermore, the resistance of the amorphous silicon resistor can be varied by changing the voltages applied to the source and drain of the amorphous silicon resistor (e.g., resistance is reduced when a larger voltage is applied.)

Figure 5:
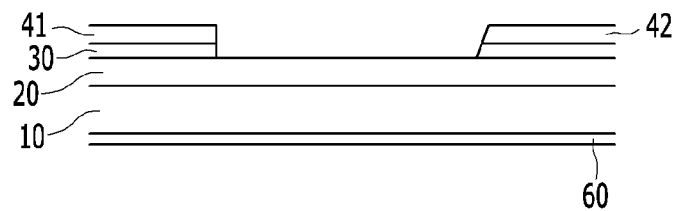
FIG. 5 illustrates a TFT resistor according to a first exemplary embodiment.

FIG. 5 illustrates a TFT resistor according to a first exemplary embodiment.

The TFT resistor according to the first exemplary embodiment of FIG. 5 has a similar configuration to the amorphous silicon resistor of FIG. 3 except for the following difference. In the first exemplary embodiment of FIG. 5, a gate electrode 60 is additionally formed on a lower portion of the insulating layer 10. The TFT resistor according to the first exemplary embodiment has the same configuration as the switching TFT used for the switching element of the liquid crystal display. As a result, the TFT resistor according to the first exemplary embodiment may be manufactured at the same time as the switching TFT without requiring an additional manufacturing process.

When a voltage is applied to the gate electrode in the TFT resistor of FIG. 5, carriers (electrons) move to the upper portion of the amorphous silicon layer 20 to form a conductive region, which further reduces resistance of the TFT resistor compared to the amorphous silicon resistor of FIG. 3. Furthermore, the resistance of the TFT resistor of FIG. 5 may be controlled by changing the voltage applied to the gate electrode.

The resistance of the TFT resistor is calculated based on a slope of an I-V (current-voltage) curve according to Ohm's law. Accordingly, when the slope of the I-V curve is changed, the resistance is changed.

Electrical characteristics of the TFT resistor of FIG. 5 and the amorphous silicon resistor of FIG. 3 are next described with reference to FIG. 6. Specifically, FIG. 6 is a graph comparing the I-V characteristics of the amorphous silicon resistor of FIG. 3 and the TFT resistor of FIG. 5.

Figure 6:
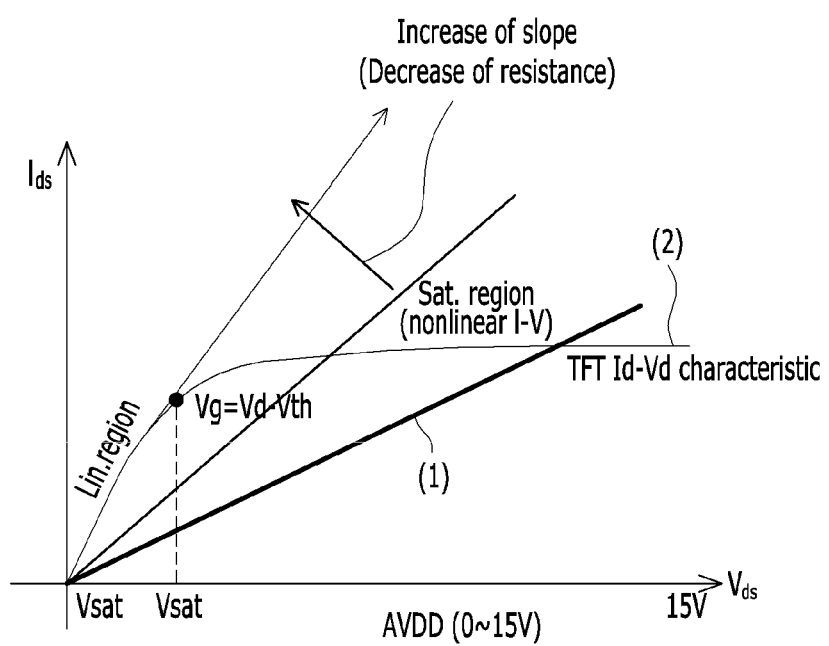
FIG. 6 is a graph comparing the I-V characteristics of the amorphous silicon resistor of FIG. 3 and the TFT resistor of FIG. 5.

Referring to FIG. 6, it is observed that a first I-V characteristic curve (1) of the amorphous silicon resistor is almost linear. In contrast, a second I-V characteristic curve (2) of the TFT resistor is almost linear in a section (a linear section) in which the voltage $V_{ds}$ is less than a saturation voltage Vsat, and non-linear in another section (a saturation section) in which the voltage $V_{ds}$ is greater than the saturation voltage Vsat. Furthermore, the resistance of the TFT resistor increases in the saturation section since the slope of the I-V curve is reduced.

Figure 7:
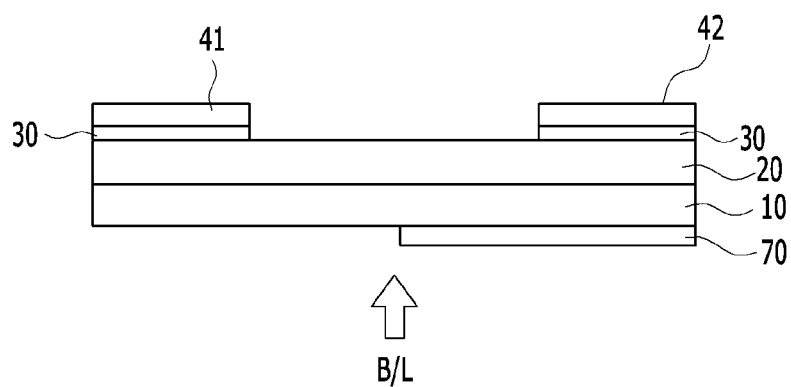
FIGS. 7, 8, 9(A) and 9(B) illustrate a TFT resistor according to a second exemplary embodiment.

FIG. 7 illustrates a TFT resistor according to a second exemplary embodiment.

The TFT resistor according to the second exemplary embodiment of FIG. 7 has a similar configuration to the TFT resistor of FIG. 5 except for the following difference. In the second exemplary embodiment of FIG. 7, the gate electrode is not formed on the entire lower portion of the insulating layer 10. Instead, referring to FIG. 7, a gate electrode 70 is formed on a partial region of the insulating layer 10 overlapping one of the source electrode and the drain electrode.

The TFT resistor of FIG. 7 is henceforth referred to as a half-gate TFT resistor so as to distinguish it from the TFT resistor of FIG. 5.

As previously described, the resistance of the TFT resistor of FIG. 5 can be controlled by changing the voltage applied to the gate electrode 60. However, the gate electrode 60 is formed over the entire insulating layer 10, which blocks the light provided by the backlight and reduces the photoconductive characteristic of the amorphous silicon. Since the photo-conductive characteristic of the TFT resistor of FIG. 5 is reduced, it may be difficult to manufacture the TFT resistor of FIG. 5 with low resistance.

In contrast, the resistance of the half-gate TFT resistor of FIG. 7 can be controlled by changing the voltage applied to the gate electrode 70 even when light from the backlight is being transmitted, since the gate electrode 70 is formed only on a partial region of the insulating layer 10. As a result, the TFT resistor of FIG. 7 is photo-conductive and has a resistance that can be easily controlled.

According to the second exemplary embodiment, a half-gate TFT resistor having a desired resistance can be manufactured by controlling an intensity of the backlight luminance, a channel size of the TFT resistor, and a voltage applied to the gate electrode.

In the half-gate TFT resistor of FIG. 7, when the direction of the current flowing to the source electrode 41 and the drain electrode 42 is changed, the resistance of the half-gate TFT resistor is also changed (i.e., an asymmetric characteristic). That is, a resistance (referred to as positive resistance) when a voltage that is greater than a voltage applied to the drain electrode 42 is applied to the source electrode 41 (i.e., when a positive voltage is applied) will be different from another resistance (referred to as negative resistance) when a voltage that is less than a voltage applied to the drain electrode 42 is applied to the source electrode 41 (i.e., when a negative voltage is applied.)

A difference between the positive resistance and the negative resistance is generated because the gate electrode 70 shown in FIG. 7 is not formed overlapping both the source electrode 41 and the drain electrode 42. Instead, the gate electrode 70 is formed overlapping only one of the electrodes (e.g., the drain electrode 42, as shown in FIG. 7.)

In the half-gate TFT resistor of FIG. 7, when a voltage is applied to the gate electrode 70, carriers (electrons) move to the lower portion of the drain electrode 42 to form a conductive region but no carriers move to the lower portion 41 of the source electrode, and thus the half-gate TFT resistor has an asymmetric I-V characteristic curve. That is, the current flowing to the source electrode 41 without a lower gate has a logarithmic characteristic, but the current flowing to the drain electrode 42 with the lower gate electrode 70 has a linear characteristic. Therefore, when the negative voltage is applied to the half-gate TFT resistor (i.e., a high voltage is applied to the drain electrode), a relatively high negative current I2 flows. Conversely, when the positive voltage is applied (i.e., a high voltage is applied to the source electrode), a relatively low positive current flows. It is noted that the negative resistance is less than the positive resistance.

Therefore, when the half-gate TFT resistor of FIG. 7 is used as the resistor 523 in the pixel configuration shown in FIG. 2, the voltage (a positive charged voltage) charged in the second liquid crystal capacitor (Clc_L) when a positive voltage is applied will be less than the voltage (a negative charged voltage) charged in the second liquid crystal capacitor (Clc_L) when a negative voltage is applied, since the negative resistance is less than the positive resistance. However, when the same data voltage is applied, the resistance can vary by the polarity and a different voltage from the determined voltage may be applied to the second sub pixel.

To solve the abnormal pixel operation problem generated by the asymmetry of the positive resistance and the negative resistance, the half-gate TFT resistors may be coupled in parallel, as described below with reference to FIG. 8.

Figure 8:
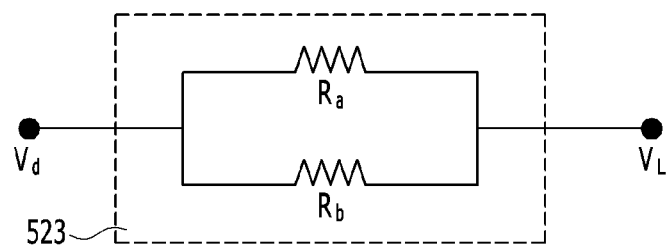

FIG. 8 illustrates an equivalent circuit of a TFT resistor according to the second exemplary embodiment. In the embodiment of FIG. 8, first and second half-gate TFT resistors (Ra, Rb) are coupled in parallel.

The first half-gate TFT resistor (Ra) and the second half-gate TFT resistor (Rb) correspond to resistors having a gate electrode on a lower portion of another electrode (e.g., a drain electrode).

Figure 9A:
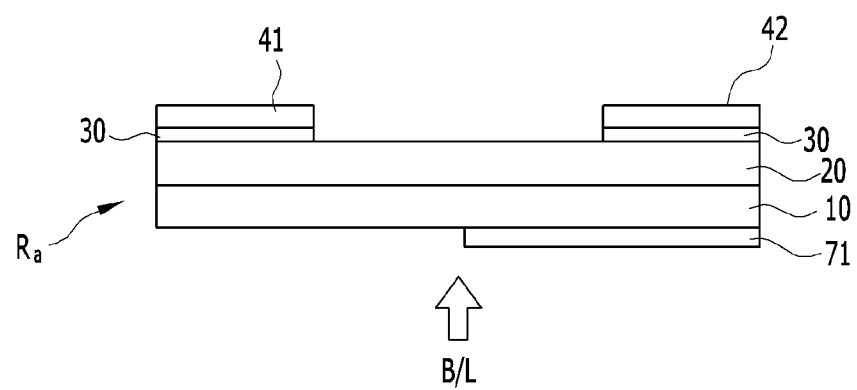
Figure 9B:
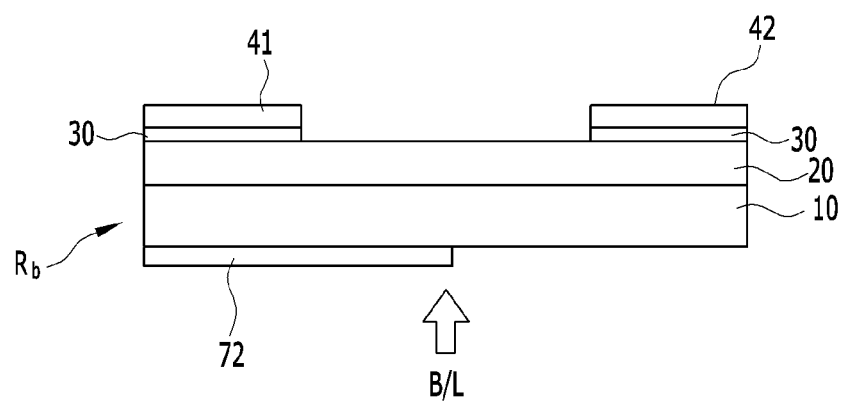

Referring to FIG. 9(A), the first half-gate TFT resistor (Ra) includes a gate electrode 71 formed on a lower portion of the drain electrode 42. Referring to FIG. 9(B), the second half-gate TFT resistor (Rb) includes a gate electrode 72 formed on a lower portion of the source electrode 41.

As described above, according to the second exemplary embodiment, resistance is further reduced, and the asymmetric I-V characteristic (whereby the positive resistance is different from the negative resistance) of the half-gate TFT resistor is mitigated by coupling the half-gate TFT resistors in parallel.

Figure 10:
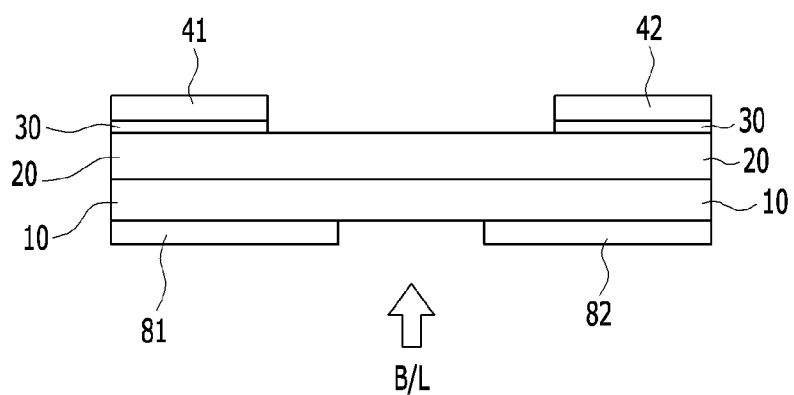
FIGS. 10, 11(A) and 11(B) illustrate a TFT resistor according to a third exemplary embodiment.

FIG. 10 illustrates a TFT resistor according to a third exemplary embodiment.

The TFT resistor according to the third exemplary embodiment of FIG. 10 has a similar configuration to the TFT resistor of FIG. 5 except for the following difference. In the embodiment of FIG. 10, the gate electrode is not formed on the entire lower portion of the insulating layer 10. Instead, referring to FIG. 10, gate electrodes 81 and 82 are respectively formed in a region of the insulating layer 10 corresponding to the source electrode 41 and a region of the insulating layer 10 corresponding to the drain electrode 42. As shown in FIG. 10, no gate electrode is formed on a lower portion of a center region of the insulating layer 10. The TFT resistor of FIG. 10 is henceforth referred to as a split-gate TFT resistor.

Similar to the half-gate TFT resistor of FIG. 7, the resistance of the split-gate TFT resistor of FIG. 10 may be controlled by changing the voltage applied to the gate electrodes 81 and 82. As a result, the TFT resistor of FIG. 10 is photo-conductive and has a resistance that can be easily controlled.

The split-gate TFT resistor of FIG. 10 includes the gate electrodes 81 and 82 respectively formed in a region of the insulating layer 10 corresponding to the source electrode 10 and a region of the insulating layer 10 corresponding to the drain electrode 10. As a result, the split-gate TFT resistor of FIG. 10 has a symmetric I-V characteristic, unlike the half-gate TFT resistor of FIG. 7 which has an asymmetric I-V characteristic (whereby the positive resistance is different from the negative resistance).

Figure 11A:
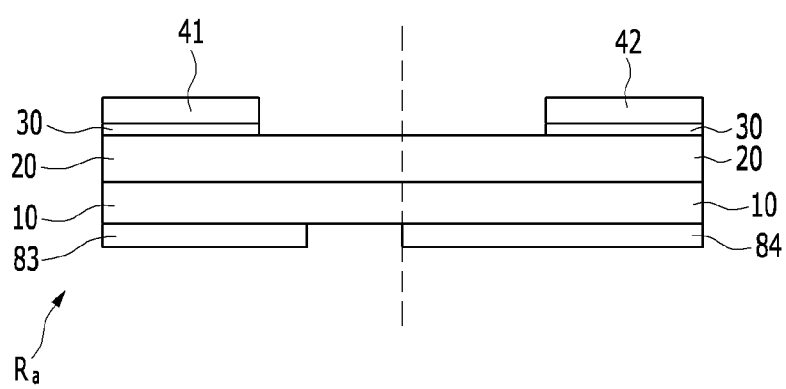
Figure 11B:
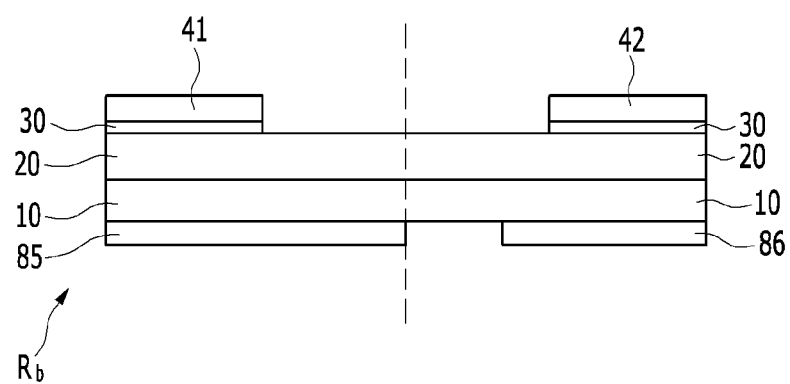

However, an asymmetric resistance characteristic may be generated in the split-gate TFT resistor of FIG. 10 by an overlay shift that may occur during the manufacturing process. As shown in FIGS. 11(A) and 11(B), an arrangement of the lower gate electrode layer may be different from an arrangement of the upper source/drain electrode layers, which may cause asymmetry. Even though asymmetry may be caused by the overlay shift during the manufacturing process, it is noted that the asymmetry in the split-gate TFT resistor of FIG. 10 is still less severe than the asymmetry of the half-gate TFT resistor of FIG. 7.

To mitigate the asymmetry problem generated by the overlay shift between the lower gate electrode layer and the upper source/drain electrode layers, a first split-gate TFT resistor further leaning to the drain electrode 42 and a second split-gate TFT resistor further leaning to the source electrode 41 may be coupled in parallel.

According to one or more of the above-described exemplary embodiments, a liquid crystal display in a vertical alignment (VA) mode includes a pixel configuration in which a subpixel includes an amorphous silicon resistor or a TFT resistor, so as to achieve a high aperture ratio for the liquid crystal display. Furthermore, according to one or more of the exemplary embodiments, to improve the resistance characteristic and reduce the resistance of the resistor, TFT resistors having an asymmetric resistance characteristic can be coupled in parallel within the liquid crystal display.

The accompanying drawings and described embodiments are merely exemplary and are used to describe the inventive concept, but do not limit the scope of the inventive concept as defined by the following claims. Thus, it will be understood by those of ordinary skill in the art that various modifications may be made to the embodiments.

What is claimed is:

1. A liquid crystal display comprising:
   a liquid crystal panel including a plurality of gate lines including a first gate line, a plurality of data lines including a first data line, and a plurality of pixels including a first pixel connected to the first gate line and the first data line, wherein the first pixel is configured to receive a common voltage;

a data driver connected to the data line and configured to apply a data voltage; and a gate driver connected to the gate line and configured to apply a gate voltage, wherein the first pixel includes:

a first subpixel including a first thin film transistor connected to the first gate line and the first data line, and a first liquid crystal capacitor, wherein a first terminal of the first liquid crystal capacitor is electrically connected to the first thin film transistor and a second terminal of the first liquid crystal capacitor is configured to receive the common voltage; and a second subpixel including:

a second thin film transistor including a first electrode, a second electrode, and a gate electrode, wherein the gate electrode is connected to the first gate line and the first electrode is connected to the first data line;

a second liquid crystal capacitor including a first terminal and a second terminal, wherein the first terminal of the second liquid crystal capacitor is configured to receive the common voltage; and a thin film transistor resistor including a first terminal and a second terminal, wherein the first terminal of the thin film transistor resistor is connected to the second electrode of the second thin film transistor, and the second terminal of the thin film transistor resistor is connected to the second terminal of the second liquid crystal capacitor, wherein the thin film transistor resistor includes:

a first thin film transistor resistor, wherein a positive resistance of the first thin film transistor resistor is less than a negative resistance of the first thin film transistor resistor; and a second thin film transistor resistor coupled to the first thin film transistor in parallel, wherein a positive resistance of the second thin film transistor resistor is greater than a negative resistance of the second thin film transistor resistor.

2. The liquid crystal display of claim 1, wherein the thin film transistor resistor includes:

an insulating layer;

an amorphous silicon layer formed on an upper portion of the insulating layer;

a first ohmic contact layer and a second ohmic contact layer formed respectively on upper portions of a first region and a second region of the amorphous silicon layer;

a first electrode and a second electrode formed respectively on upper portions of partial regions of the first ohmic contact layer and the second ohmic contact layer; and a third electrode formed on a lower portion of the insulating layer, wherein a resistance of the thin film transistor resistor is controlled by a voltage applied to the third electrode.

3. The liquid crystal display of claim 2, wherein the third electrode is formed on a lower portion of a region of the insulating layer overlapping the first electrode, and is not formed on a lower portion of a region of the insulating layer overlapping the second electrode.

4. The liquid crystal display of claim 3, wherein the resistance of the thin film transistor resistor is controlled by light from a backlight irradiated onto the lower portion of the insulating layer.

5. The liquid crystal display of claim 2, wherein the third electrode is separately formed on the lower portion of the region of the insulating layer overlapping the first electrode, and on the lower portion of the region of the insulating layer overlapping the second electrode.

6. The liquid crystal display of claim 5, wherein the resistance of the thin film transistor resistor is controlled by light from a backlight irradiated onto the lower portion of the insulating layer.

7. A liquid crystal display comprising:

a liquid crystal panel including a plurality of gate lines including a first gate line, a plurality of data lines including a first data line, and a plurality of pixels including a first pixel connected to the first gate line and the first data line, wherein the first pixel is configured to receive a common voltage;

a data driver connected to the data line and configured to apply a data voltage; and a gate driver connected to the gate line and configured to apply a gate voltage, wherein the first pixel includes:

a first subpixel including a first thin film transistor connected to the first gate line and the first data line, and a first liquid crystal capacitor, wherein a first terminal of the first liquid crystal capacitor is electrically connected to the first thin film transistor and a second terminal of the first liquid crystal capacitor is configured to receive the common voltage; and a second subpixel including a second thin film transistor connected to the first gate line and the first data line, a second liquid crystal capacitor, wherein a first terminal of the second liquid crystal capacitor is configured to receive the common voltage, and a thin film transistor resistor electrically connected between the second thin film transistor and a second terminal of the second liquid crystal capacitor, wherein the thin film transistor resistor includes:

a first thin film transistor resistor, wherein a positive resistance of the first thin film transistor resistor is less than a negative resistance of the first thin film transistor resistor; and a second thin film transistor resistor coupled to the first thin film transistor in parallel, wherein a positive resistance of the second thin film transistor resistor is greater than a negative resistance of the second thin film transistor resistor.

8. The liquid crystal display of claim 7, wherein each of the first thin film transistor resistor and the second thin film transistor resistor includes:

an insulating layer;

an amorphous silicon layer formed on an upper portion of the insulating layer;

a first ohmic contact layer and a second ohmic contact layer formed respectively on upper portions of a first region and a second region of the amorphous silicon layer;

a first electrode and a second electrode formed respectively on upper portions of partial regions of the first ohmic contact layer and the second ohmic contact layer; and a third electrode formed on a lower portion of the insulating layer, wherein a third electrode of the first thin film transistor resistor is formed on the lower portion of the region of the insulating layer overlapping the first electrode, and is not formed on the lower portion of the region of the insulating layer overlapping the second electrode, and wherein a third electrode of the second thin film transistor resistor is formed on the lower portion of the region of the insulating layer overlapping the second electrode, and is not formed on the lower portion of the region of the insulating layer overlapping the first electrode.

9. The liquid crystal display of claim 8, wherein each of the first thin film transistor resistor and the second thin film transistor includes:
  an insulating layer;
  an amorphous silicon layer formed on an upper portion of the insulating layer;
  a first ohmic contact layer and a second ohmic contact layer formed respectively on upper portions of a first region and a second region of the amorphous silicon layer;
  a first electrode and a second electrode formed respectively on upper portions of partial regions of the first ohmic contact layer and the second ohmic contact layer; and
  a third electrode formed on the lower portion of the region of the insulating layer overlapping the first electrode, and on the lower portion of the region of the insulating layer overlapping the second electrode.

10. A thin film transistor resistor comprising:
  an insulating layer;
  an amorphous silicon layer formed on an upper portion of the insulating layer;
  a first ohmic contact layer and a second ohmic contact layer formed respectively on upper portions of a first region and a second region of the amorphous silicon layer;
  a first electrode and a second electrode formed respectively on upper portions of partial regions of the first ohmic contact layer and the second ohmic contact layer; and
  a third electrode formed on a lower portion of the insulating layer,
  wherein a resistance of the thin film transistor resistor is controlled by a voltage applied to the third electrode and by light from a backlight irradiated onto the lower portion of the insulating layer,
  wherein the thin film transistor resistor includes:
    a first thin film transistor resistor, wherein a positive resistance of the first thin film transistor resistor is less than a negative resistance of the first thin film transistor resistor; and
    a second thin film transistor resistor coupled to the first thin film transistor in parallel, wherein a positive resistance of the second thin film transistor resistor is greater than a negative resistance of the second thin film transistor resistor.

11. The thin film transistor resistor of claim 10, wherein the third electrode is formed on a lower portion of a region of the insulating layer overlapping the first electrode, and is not formed on a lower portion of a region of the insulating layer overlapping the second electrode.

12. The thin film transistor resistor of claim 10, wherein the third electrode is separately formed on the lower portion of the region of the insulating layer overlapping the first electrode, and on the lower portion of the region of the insulating layer overlapping the second electrode.

13. The thin film transistor resistor of claim 12, wherein the resistance of the thin film transistor resistor is controlled by light from a backlight irradiated onto the lower portion of the insulating layer.

14. The thin film transistor resistor of claim 10, wherein each of the first thin film transistor resistor and the second thin film transistor includes:
  an insulating layer;
  an amorphous silicon layer formed on an upper portion of the insulating layer;
  a first ohmic contact layer and a second ohmic contact layer formed respectively on upper portions of a first region and a second region of the amorphous silicon layer;
  a first electrode and a second electrode formed respectively on upper portions of partial regions of the first ohmic contact layer and the second ohmic contact layer; and
  a third electrode formed on the lower portion of the region of the insulating layer overlapping the first electrode, and on the lower portion of the region of the insulating layer overlapping the second electrode.

15. The thin film transistor resistor of claim 10, wherein each of the first thin film transistor resistor and the second thin film transistor includes:
  an insulating layer;
  an amorphous silicon layer formed on an upper portion of the insulating layer;
  a first ohmic contact layer and a second ohmic contact layer formed respectively on upper portions of a first region and a second region of the amorphous silicon layer;
  a first electrode and a second electrode formed respectively on upper portions of partial regions of the first ohmic contact layer and the second ohmic contact layer; and
  a third electrode formed on the lower portion of the region of the insulating layer overlapping the first electrode, and on the lower portion of the region of the insulating layer overlapping the second electrode.

* * * * *